United States Patent
Koujima et al.

(10) Patent No.: US 9,634,735 B2
(45) Date of Patent: Apr. 25, 2017

(54) MAGNETIC ANTENNA, AND RF TAG AND BOARD MOUNTED WITH THE RF TAG

(75) Inventors: Jun Koujima, Hiroshima-ken (JP);
Satoshi Ohmae, Hiroshima-ken (JP);
Tetsuya Kimura, Hiroshima-ken (JP);
Yoshiro Sato, Tokyo (JP)

(73) Assignee: TODA KOGYO CORPORATION, Hiroshima (JP)

( * ) Notice: Subject to any disclaimer, the term of this patent is extended or adjusted under 35 U.S.C. 154(b) by 523 days.

(21) Appl. No.: 13/146,276

(22) PCT Filed: Jan. 28, 2010

(86) PCT No.: PCT/JP2010/051162
§ 371 (c)(1),
(2), (4) Date: Oct. 2, 2012

(87) PCT Pub. No.: WO2010/087413
PCT Pub. Date: Aug. 5, 2010

(65) Prior Publication Data
US 2013/0020394 A1 Jan. 24, 2013

(30) Foreign Application Priority Data
Jan. 30, 2009 (JP) ................. 2009-020584

(51) Int. Cl.
*G06K 19/06* (2006.01)
*H04B 5/00* (2006.01)
*H01Q 7/08* (2006.01)
*H01Q 1/22* (2006.01)
*H05K 1/16* (2006.01)

(52) U.S. Cl.
CPC ......... *H04B 5/0087* (2013.01); *H01Q 1/2225* (2013.01); *H01Q 7/08* (2013.01); *H05K 1/165* (2013.01); *H05K 2203/162* (2013.01)

(58) Field of Classification Search
CPC ......... G06K 19/07749; G06K 19/0723; G06K 7/0008; G06K 19/0726; G06K 19/0672;
(Continued)

(56) References Cited

U.S. PATENT DOCUMENTS 2,354,332 A    7/1944  Polydoroff
5,218,189 A *  6/1993  Hutchison ................ 235/439
(Continued)

FOREIGN PATENT DOCUMENTS

EP    1 628 358 A1    2/2006
EP    1 944 827 A2    7/2008
(Continued)

OTHER PUBLICATIONS www.atmel.com, "Tag Tuning", all pages.*
(Continued)

*Primary Examiner* — Thien T Mai
(74) *Attorney, Agent, or Firm* — Nixon & Vanderhye P.C.

(57) ABSTRACT

The present invention relates to an RF tag comprising a magnetic antenna for transmitting and receiving information using an electromagnetic induction method, and an IC mounted to the magnetic antenna, wherein the magnetic antenna comprises a magnetic core and a plurality of coils formed on the magnetic core; the coils each have an inductance $L_1$ satisfying the specific relational formula, and are connected in parallel to each other in an electric circuit and disposed in series on the magnetic core; and a combined inductance $L_0$ of the magnetic antenna satisfies the specific relational formula. The RF tag of the present invention is used as a magnetic antenna for information communication using a magnetic field component which is capable of satisfying both reduction in size and improvement in communication sensitivity.

3 Claims, 9 Drawing Sheets

(58) Field of Classification Search
CPC ............. G06K 7/10336; G06K 19/045; G06K 19/0701; G06K 19/07779; G06K 19/07783; G06K 7/10178; G06K 19/0715; G06K 19/0773; G06K 19/07767; G06K 19/07771; G06K 19/07784; G06K 19/07786; G06K 7/10316; G06K 9/6224; G06K 9/6253; G06K 19/07; G06K 19/077; G06K 19/07718; G06K 19/0775; G06K 19/07758; G06K 19/0776; G06K 19/07764; G06K 19/07773; G06K 19/07792; G06K 19/10; G06K 7/10009; G06K 7/10217; G06K 7/10237; G06K 7/10356; G06K 7/10386; H01Q 1/38; H01Q 1/2225; H01Q 7/08; H01Q 9/285; H01Q 7/06; H01Q 13/106; H01Q 9/27; H04B 5/0081; H04B 5/02; H04B 5/00
USPC ........................................................ 235/492
See application file for complete search history.

(56) References Cited

U.S. PATENT DOCUMENTS 6,837,438 B1 * 1/2005 Takasugi et al. ............. 235/492
2001/0000960 A1   5/2001 Dettloff
2003/0119469 A1   6/2003 Karr et al.
2008/0150693 A1 * 6/2008 You ...................... G06K 7/0008
                                                                  340/10.1

FOREIGN PATENT DOCUMENTS

| JP | 09-064634   | 3/1997  |
|----|-------------|---------|
| JP | 2000-105802 | 4/2000  |
| JP | 2001-028037 | 1/2001  |
| JP | 2005-33278  | 2/2005  |
| JP | 2005-033278 | 2/2005  |
| JP | 2007-019891 | 1/2007  |
| JP | 2007-295360 | 11/2007 |
| JP | 2008-035464 | 2/2008  |
| JP | 2009-17593  | 1/2009  |
| JP | 2009-017593 | 1/2009  |

OTHER PUBLICATIONS

English translation of Notice of Reasons for Rejection in JP SN 2010-016689 mailed Mar. 19, 2013.
International Search Report for PCT/JP2010/051162, mailed May 11, 2010.
Supplementary European Search Report in EP 10 73 5878 dated Oct. 2, 2013.

* cited by examiner

MAGNETIC ANTENNA, AND RF TAG AND BOARD MOUNTED WITH THE RF TAG

This application is the U.S. national phase of International Application No. PCT/JP2010/051162 filed 28 Jan. 2010 which designated the U.S. and claims priority to JP Patent Application No. 2009-020584 filed 30 Jan. 2009, the entire contents of each of which are hereby incorporated by reference.

TECHNICAL FIELD

The present invention relates to a magnetic antenna for information communication using a magnetic field component, and an RF tag. The magnetic antenna and the RF tag according to the present invention can be improved in communication sensitivity as compared to those in the conventional art.

BACKGROUND ART

An antenna for transmitting and receiving an electromagnetic wave using a magnetic material (hereinafter referred to merely as a "magnetic antenna"), in which a magnetic field component coming from the outside is allowed to pass through the core (magnetic material), around which a coil of a conductive wire is wound, to convert the magnetic field component into a voltage (or current) induced by the coil, has been widely used in small sized radios and TVs. Such a magnetic antenna is also used in a non-contact object identification device called RF tag which has recently widely come into use.

To transmit and receive an electromagnetic wave with a higher frequency, a loop antenna free of a magnetic material and including a loop coil having a coil surface parallel to an object to be identified is used in RF tags. When the frequency is much higher (UHF band or microwave band), an electric field antenna (dipole antenna or dielectric antenna) for detecting an electric field component instead of a magnetic field component is widely used in such RF tags.

However, the loop antenna and electric field antenna have the following problems. That is, when such an antenna comes close to a metallic object, an image (mirror effect) is generated on the metallic object. Since the magnetic field of the image has a phase opposite to that of the antenna, the sensitivity of the antenna tends to be lost.

On the other hand, there is also known a magnetic antenna for transmitting and receiving a magnetic component which comprises a magnetic layer as a central core, an coil-shaped electrode material wound on the core, an insulating layer formed on at least one outside surface of the core on which the coil-shaped electrode material is provided, and a conductive layer formed on at least one outside surface of the insulating layer (Patent Document 1). The magnetic antenna described in Patent Document 1 can maintain properties required for antennas even when coming into contact with metal articles.

Also, it is known that a plurality of coils are formed on a core and connected in parallel to each other to obtain an antenna (Patent Document 2).

Patent Document 1: Japanese Patent Application Laid-open (KOKAI) No. 2007-19891

Patent Document 2: Japanese Patent Application Laid-open (KOKAI) No. 9-64634

DISCLOSURE OF THE INVENTION

Problem to be Solved by the Invention

In the method described in Patent Document 1, it may be difficult to ensure a longer communication distance owing to the limitation to size of the antenna.

Also, the technique described in Patent Document 2 merely aimed at preventing deterioration in coil characteristics owing to increase in resistance of the coil, and there is no description concerning improvement in communication sensitivity.

Under these circumstances, an object of the present invention is to provide a magnetic antenna in which an inductance of a coil which is limited by a resonance frequency can be increased as compared to those in the conventional art, and which can also be improved in communication sensitivity.

Means for Solving the Problem

The above object or technical task of the present invention can be achieved by the following aspects of the present invention.

That is, in accordance with the present invention, there is provided an RF tag comprising a magnetic antenna for transmitting and receiving information using an electromagnetic induction method, and an IC mounted to the magnetic antenna, which magnetic antenna comprises a magnetic core and a plurality of coils formed on the magnetic core, which coils each have an inductance $L_1$ satisfying the following relational formula (1), and are connected in parallel to each other in an electric circuit and disposed in series on the magnetic core, a combined inductance $L_0$ of the magnetic antenna satisfying the following relational formula (2):

$L_1 \geq 1/(4\pi^2 \times (\text{operating frequency})^2 \times (\text{capacitance of } IC + \text{parasitic capacitance of antenna}))$ <Relational formula (1)> wherein $L_1$ is an inductance per one coil;

$L_1 \geq 1/(4\pi^2 \times (\text{operating frequency})^2 \times (\text{capacitance of } IC + \text{parasitic capacitance of antenna}))$ <Relational formula (2)> wherein $L_0$ is a combined inductance of the magnetic antenna.

Also, according to the present invention, there is provided the RF tag as described in the above Invention 1, wherein the RF tag is coated with a resin (Invention 2).

In addition, according to the present invention, there is provided a magnetic antenna for use with the RF tag as described in the above Invention 1, wherein when the IC is mounted to the magnetic antenna, a plurality of the coils formed on the magnetic core each have an inductance $L_1$ satisfying the following relational formula (1), and are connected in parallel to each other in an electric circuit and disposed in series on the magnetic core; and a combined inductance $L_0$ of the magnetic antenna satisfies the following relational formula (2) (Invention 3):

$L_1 \geq 1/(4\pi^2 \times (\text{operating frequency})^2 \times (\text{capacitance of } IC + \text{parasitic capacitance of antenna}))$ <Relational formula (1)> wherein $L_1$ is an inductance per one coil;

$L_0 \leq 1/(4\pi^2 \times (\text{operating frequency})^2 \times (\text{capacitance of } IC + \text{parasitic capacitance of antenna}))$ <Relational formula (2)> wherein $L_0$ is a combined inductance of the magnetic antenna.

Further, according to the present invention, there is provided a board mounted with the RF tag as described in the above Invention 1 or 2 (Invention 4).

In addition, according to the present invention, there is provided a communication system mounted with the RF tag as described in the above Invention 1 or 2 (Invention 5).

Effect of the Invention

The RF tag of the present invention has a further enhanced sensitivity, can be used even for a longer distance communication. Therefore, the RF tag can be suitably used in the applications such as 13.56 MHz RFID.

The magnetic antenna and the RF tag of the present invention have a high communication sensitivity and, therefore, can be suitably used in various applications such as various portable equipments, containers, metal parts, boards, metal tools and metal molds.

EXPLANATION OF REFERENCE NUMERALS

1: Through-hole; 2: electrode layer (coil electrode); 3: core; 4: coil; 4-1: minimum unit of coil; 4-2: coil open end; 5: magnetic layer; 6: insulating layer; 7: conductive layer; 8: non-magnetic layer; 9: IC connecting electrode layer (terminal); 10: IC; 11: capacitor electrode; 12: capacitor; 14: board connecting electrode layer; 15: board; 20: magnetic antenna

PREFERRED EMBODIMENT FOR CARRYING OUT THE INVENTION

The magnetic antenna of the present invention is described below.

Figure 1:
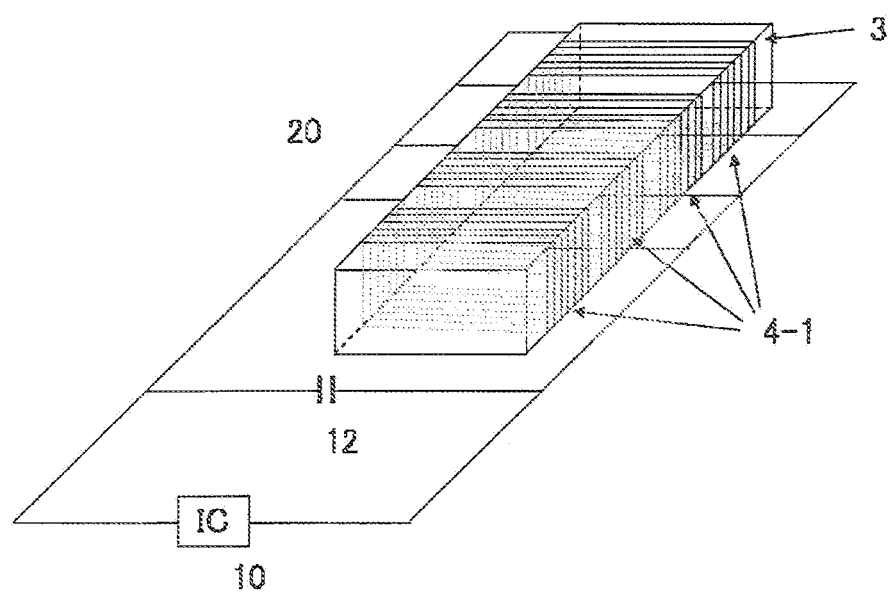
FIG. 1 is a conceptual view showing a magnetic antenna according to the present invention.
Figure 2:
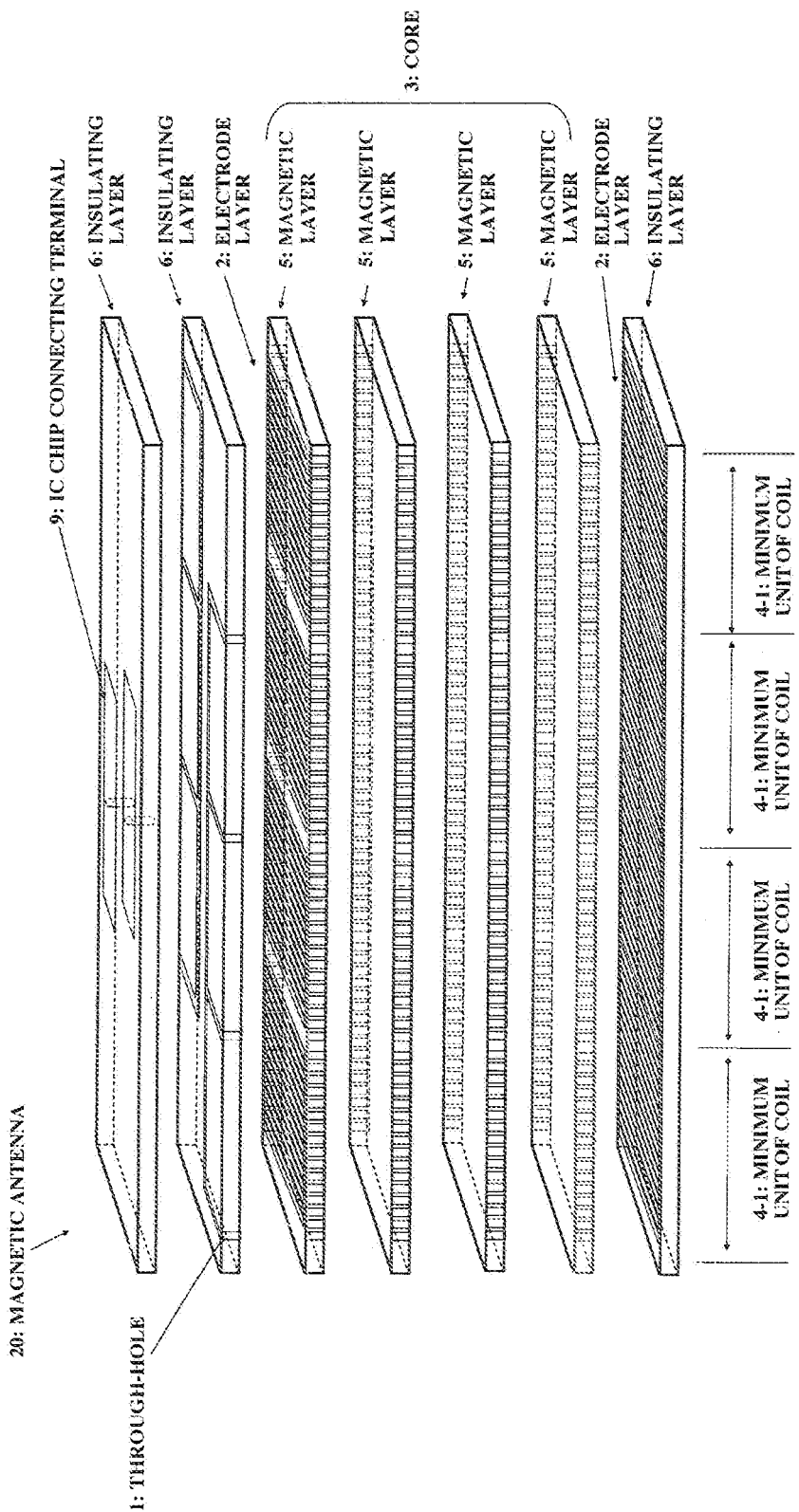
FIG. 2 is a perspective view showing a magnetic antenna according to the present invention.

In FIG. 1 and FIG. 2, there are shown schematic views of the magnetic antenna according to the present invention. As shown in FIG. 1 and FIG. 2, the magnetic antenna (20) according to the present invention has a basic structure which comprises a central core (3) formed of a magnetic material; and a coil-shaped (wire winding-shaped) electrode material disposed outside of the core (3) to form a plurality of coils (4-1) around the core, wherein a plurality of the coils (4-1) are electrically connected in parallel to each other and disposed in series on the same core (3) (although the number of the coils shown in FIG. 1 and FIG. 2 is four, the number of the coils usable in the present invention is not particularly limited thereto).

The inductance $L_1$ of the respective coils (4-1) of the magnetic antenna according to the present invention satisfies the following relational formula (1) when the IC is mounted to the magnetic antenna.

$L_1 \geq 1/(4\pi^2 \times \text{(operating frequency)}^2 \times \text{(capacitance of IC+parasitic capacitance of antenna))}$ <Relational formula (1)>

When the inductance $L_1$ of the respective coils (4-1) of the magnetic antenna is incapable of satisfying the above relational formula (1), the resulting magnetic antenna may fail to be improved in communication sensitivity. The inductance $L_1$ of the respective coils (4-1) of the magnetic antenna according to the present invention is preferably not less than 2 times and more preferably not less than 3 times the combined inductance $L_0$ of the magnetic antenna.

The combined inductance $L_0$ of the magnetic antenna satisfies the following relational formula (2) when the IC is mounted to the magnetic antenna.

$L_0 \leq 1/(4\pi^2 \times \text{(operating frequency)}^2 \times \text{(capacitance of IC+parasitic capacitance of antenna))}$ <Relational formula (2)>

When the combined inductance $L_0$ of the magnetic antenna is incapable of satisfying the above relational formula (2), the resonance frequency of the RF tag to which the IC is mounted may not be adjusted to its operating frequency, thereby failing to improve a communication sensitivity thereof. The magnetic antenna capable of satisfying the above relational formula may be produced by controlling a magnetic permeability of a material forming the core, the number of winding of the coils, a sectional area of the coils, a length of the coils, etc.

Figure 3:
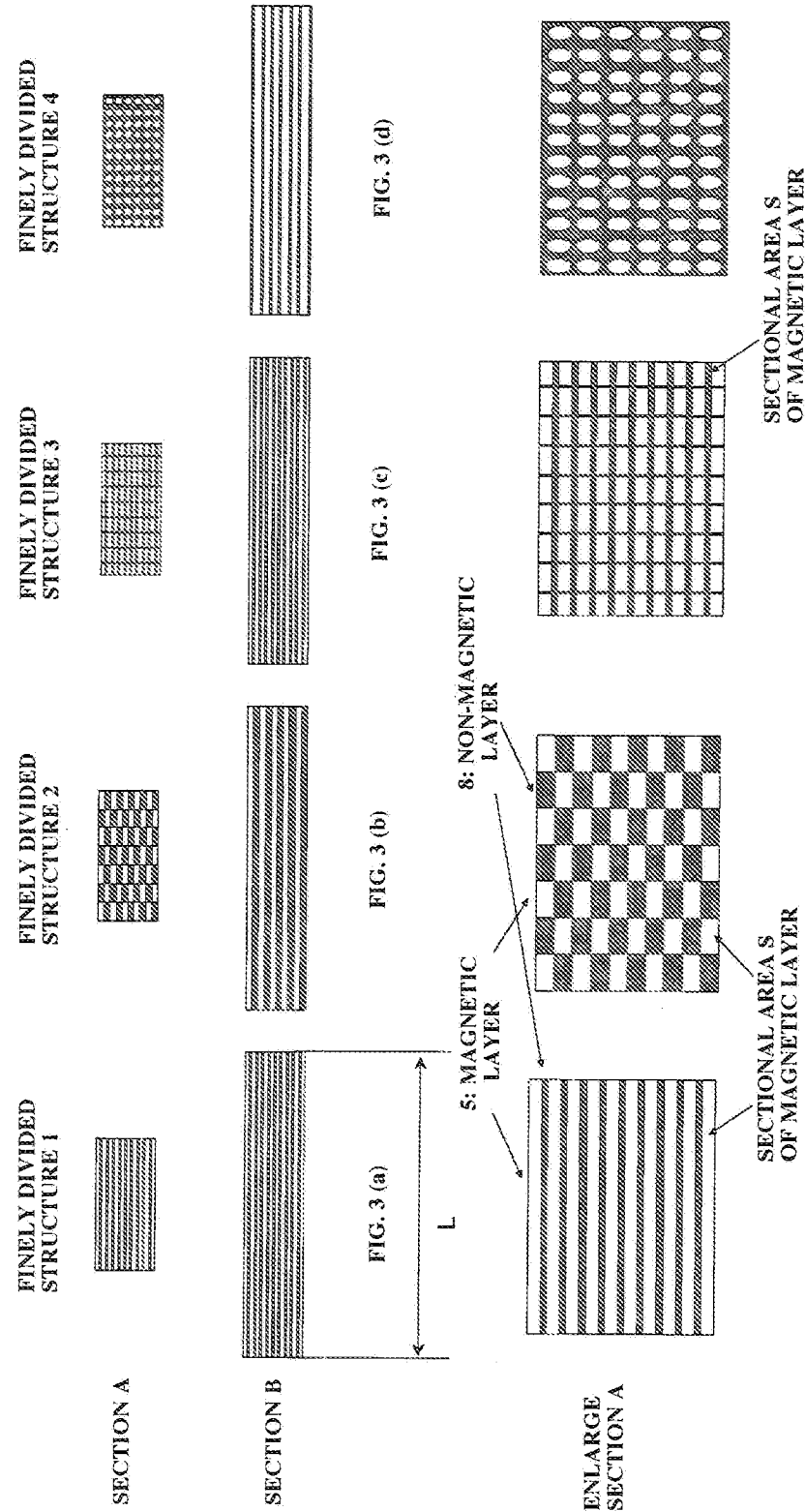
FIG. 3 is a conceptual view showing a configuration of a core used in the present invention which is divided into plural parts by non-magnetic materials.

As shown in FIG. 3, the core may have such a structure in which the magnetic material constituting the core is divided into plural parts by non-magnetic materials.

In the magnetic antenna according to the present invention, when the magnetic core is divided into plural parts by the non-magnetic materials, the divided condition is not particularly limited as long as a section of the magnetic antenna taken along the direction perpendicular to a magnetic flux penetrating through the magnetic antenna has such a condition that the magnetic material is divided by the non-magnetic materials. For example, as the divided condition, there are illustrated those conditions shown in FIG. 3(a) to FIG. 3(d).

Figure 4:
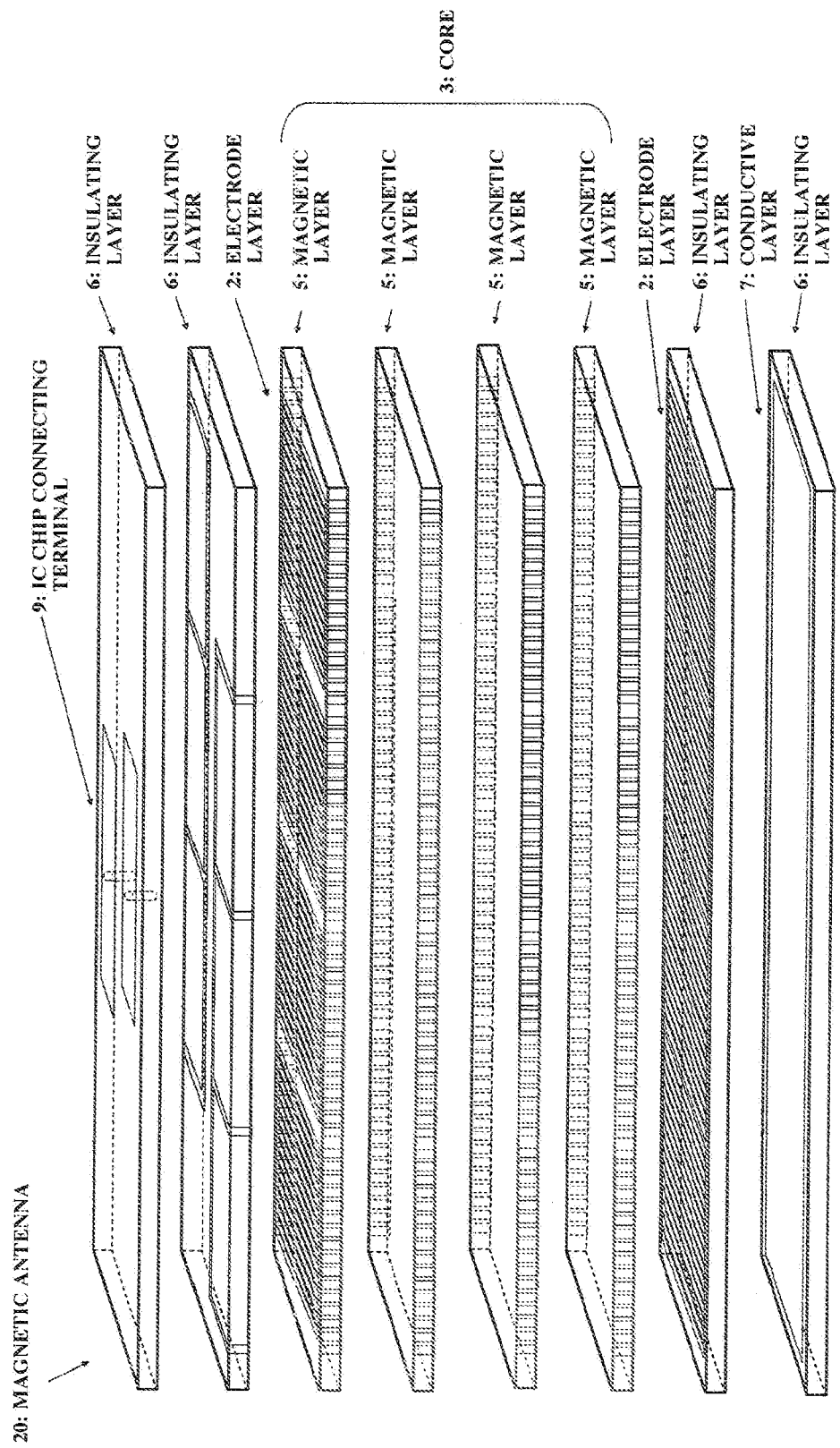
FIG. 4 is a conceptual view showing another embodiment of a magnetic antenna according to the present invention.

In FIG. 4, there is shown a schematic view of another embodiment of the magnetic antenna according to the present invention. As shown in FIG. 4, the magnetic antenna (20) according to the present invention may also have a basic structure which comprises a central core (3) formed of a magnetic material; a coil-shaped (wire winding-shaped) electrode material (2) disposed outside of the core (3) to form a plurality of coils (4-1) around the core wherein a plurality of the coils (4-1) are electrically connected in parallel to each other and disposed in series on the same core (3); an insulating layer(s) (6) formed on at least one outside surface of the core on which the coil-shaped electrode material is provided; and a conductive layer (7) formed on an outside surface of at least one of the insulating layers (6). By forming the conductive layer (7), the change in characteristics of the resulting magnetic antenna can be reduced even when a metallic object comes close to the magnetic antenna, so that the change in resonance frequency thereof can also be reduced. Further, an additional insulating layer (6) may also be provided on an outside of the conductive layer (7).

Figure 5:
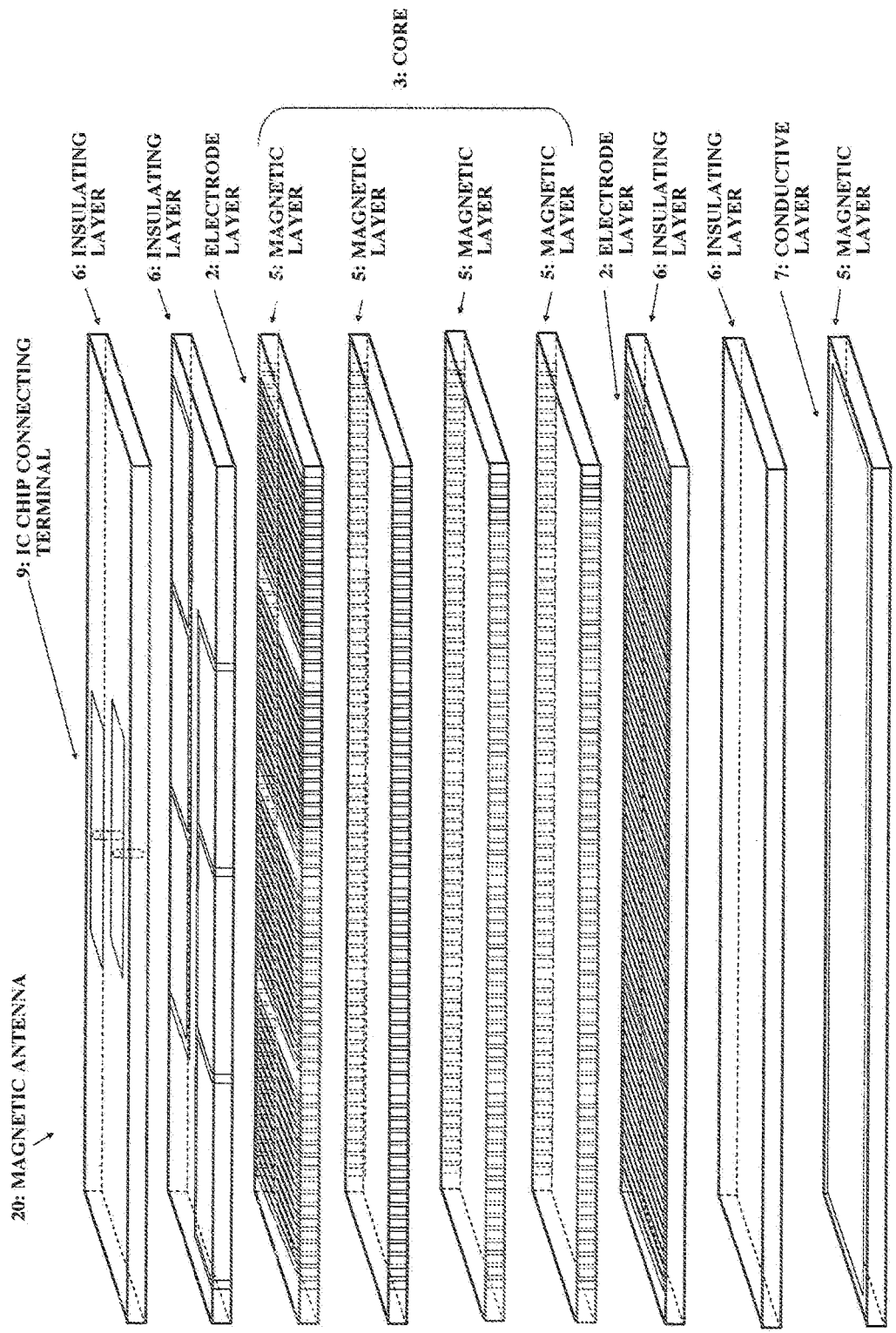
FIG. 5 is a conceptual view showing the other embodiment of a magnetic antenna according to the present invention.

In FIG. 5, there is shown a schematic view of the other embodiment of the magnetic antenna according to the present invention. As shown in FIG. 5, the magnetic antenna (20) according to the present invention may have such a structure which comprises a central core (3) formed of a magnetic material; a coil-shaped (wire winding-shaped) electrode material (2) disposed outside of the core (3) to form a plurality of coils (4-1) around the core wherein a plurality of the coils (4-1) are electrically connected in parallel to each other and disposed in series on the same core (3); an insulating layer(s) (6) formed on at least one outside surface of the core on which the coil-shaped electrode material is provided; a conductive layer (7) formed on an outside surface of at least one of the insulating layers (6); and a magnetic layer (5) formed on an outside of the conductive layer (7). By forming the magnetic layer (5), the change in characteristics of the resulting magnetic antenna can be further reduced even when a metallic object comes close to the magnetic antenna, so that the change in resonance frequency thereof can also be further reduced. Meanwhile, the magnetic antenna may also have such a laminated structure formed by eliminating the conductive layer (7) from the above structure.

Figure 6:
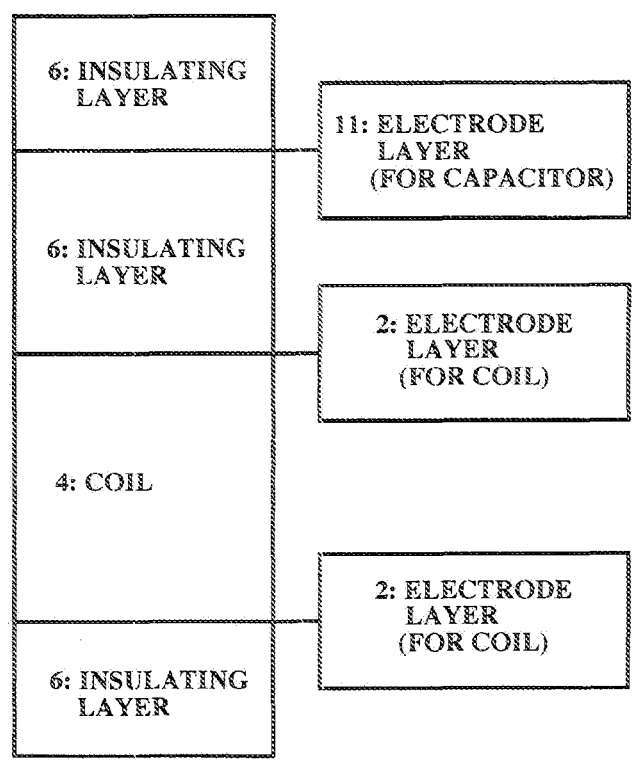
FIG. 6 is a conceptual view showing a laminated structure of a magnetic antenna according to the present invention.

In addition, as schematically shown in FIG. 6, in the magnetic antenna according to the present invention, a capacitor electrode (11) may also be provided on an outside surface of at least one of the insulating layers (6) which are disposed on an upper surface and a lower surface of the coil (4) to sandwich the coil (4) therebetween.

Meanwhile, the magnetic antenna of the present invention as schematically shown in FIG. 6 may have a parallel electrode or an interdigital electrode printed on an upper surface of the insulating layer to form a capacitor. In addition, the capacitor may be connected in parallel or in series to the coil lead terminal.

Figure 7:
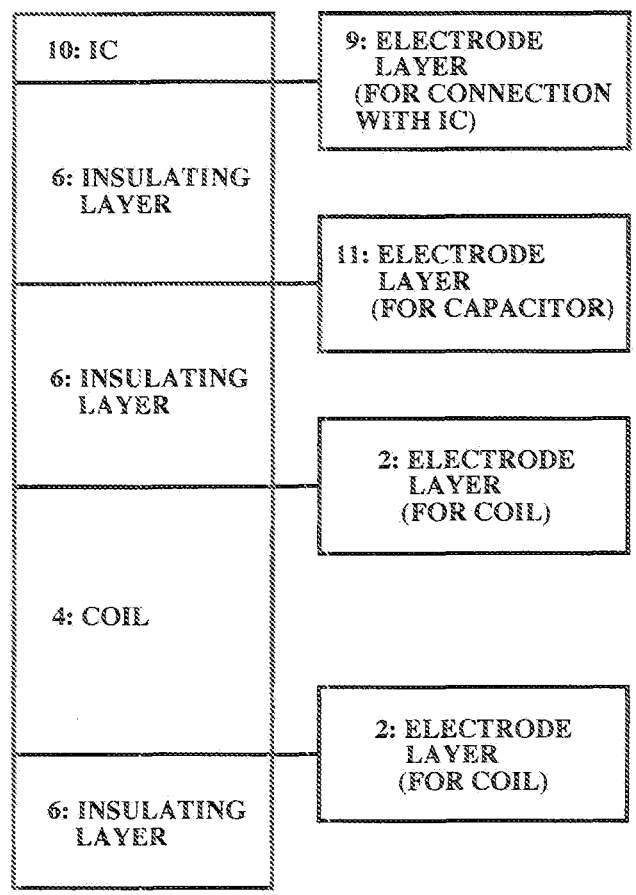
FIG. 7 is a conceptual view showing a laminated structure of a magnetic antenna according to the present invention.

Further, as schematically shown in FIG. 7, the insulating layer may be further provided on its outside surface where the capacitor electrode (11) is provided, with an additional insulting layer (6). In addition, an electrode layer (9) which also serves as an IC chip connecting terminal may be further formed on an outside surface of the thus formed insulating layer (6) such that the insulating layer (6) is sandwiched therebetween to form a capacitor which may be connected in parallel or in series to the IC chip terminal.

In addition, as shown in FIG. 2, in the magnetic antenna of the present invention, the terminal (9) capable of being connected with the IC chip (10) may be formed on an upper surface of the insulating layer (6). Meanwhile, the IC chip connecting terminal (9) and the coil lead terminal may be connected in parallel or in series and then integrally calcined.

In the magnetic antenna of the present invention, as the magnetic material of the core, there may be used Ni—Zn-based ferrite, etc. The Ni—Zn-based ferrite used in the present invention preferably has a composition comprising 45 to 49.5 mol % of $Fe_2O_3$, 9.0 to 45.0 mol % of NiO, 0.5 to 35.0 mol % of ZnO and 4.5 to 15.0 mol % of CuO. The ferrite composition may be suitably selected such that the resulting core as the magnetic material has a high magnetic permeability and a low magnetic loss in a frequency band to be used. When using a material having a excessively high magnetic permeability as the magnetic material of the core, the resulting core tends to suffer from an increased magnetic loss and as a result, tends to be unsuitable for antennas.

For example, the ferrite composition is preferably selected such that the core has a magnetic permeability of 70 to 120 at 13.56 MHz when the magnetic antenna is applied to an RFID tag, and has a magnetic permeability of 10 to 30 at 100 MHz when the magnetic antenna is used to receive commercial FM broadcasts, because the magnetic loss can be reduced.

In the magnetic antenna of the present invention, as the non-magnetic material of the core, there may be used non-magnetic ferrites such as Zn-based ferrite, glass-based ceramic materials such as borosilicate glass, zinc glass and lead glass, or mixtures comprising the non-magnetic ferrite and the glass-based ceramic material at an adequate mixing ratio.

The ferrite powder used as the non-magnetic ferrite may be selected so as to have such a Zn-based ferrite composition that a sintered body of the ferrite powder has a volume resistivity of not less than $10^8$ Ω·cm. The Zn-based ferrite composition preferably comprises 45 to 49.5 mol % of $Fe_2O_3$, 17.0 to 22.0 mol % of ZnO and 4.5 to 15.0 mol % of CuO.

The glass-based ceramic powder used as the glass-based ceramic material may be selected so as to have such a composition that its linear expansion coefficient is not largely different from that of the magnetic material used. More specifically, the composition is preferably selected such that the difference in linear expansion coefficient between the glass-based ceramic powder and a soft magnetic ferrite used as the magnetic material lies within the range of ±5 ppm/° C.

Next, the RF tag according to the present invention is described.

The RF tag according to the present invention comprises the above magnetic antenna and an IC connected to the magnetic antenna. In the perspective view of FIG. 2, there is shown the configuration of the magnetic antenna to which the IC can be mounted. Also, the magnetic antenna may be configured so as to connect with a separate IC through an electric circuit.

In addition, as shown in FIG. 2, in the RF tag of the present invention, the terminal (9) capable of being connected with the IC chip (10) may be formed on an upper surface of the insulating layer (6), and the IC chip connecting terminal and the coil lead terminal may be connected in parallel or in series and then integrally calcined.

The magnetic antenna provided thereon with the above IC chip connecting terminal may be produced as follows. That is, as shown in FIG. 2, though-holes (1) are formed through the insulating layer (6) formed on at least one surface of the coil (4) on which the electrode layer is provided. The electrode material is poured into the through-holes (1), and connected with both ends of the coil (4) to thereby form the coil lead terminal and the IC chip connecting terminal both formed of the electrode material on the surface of the insulating layer. The thus produced structure may be then integrally calcined to produce the magnetic antenna.

In the RF tag of the present invention, an inductance $L_1$ of each of the coils connected in parallel to each other satisfies the following relational formula (1), and a combined inductance $L_0$ of the magnetic antenna satisfies the following relational formula (2).

$L_1 \geq 1/(4\pi^2 \times (\text{operating frequency})^2 \times (\text{capacitance of IC+parasitic capacitance of antenna}))$ <Relational formula (1)>

$L_0 \leq 1/(4\pi^2 \times (\text{operating frequency})^2 \times (\text{capacitance of IC+parasitic capacitance of antenna}))$ <Relational formula (2)>

The RF tag of the present invention may be coated with a resin such as polystyrene, acrylonitrile styrene, acrylonitrile butadiene styrene, acryls, polyethylene, polypropylene, polyamides, polyacetals, polycarbonates, vinyl chloride, modified polyphenylene ethers, polybutylene terephthalate and polyphenylene sulfides.

Next, the process for producing the magnetic antenna according to the present invention is described.

First, a mixture prepared by mixing magnetic particles and a binder is formed into a sheet shape to form a single magnetic layer or a plurality of magnetic layers which are laminated together.

Next, as shown in FIG. 2, the magnetic layers (5) are laminated to obtain a laminate having a desired total thickness.

Figure 9:
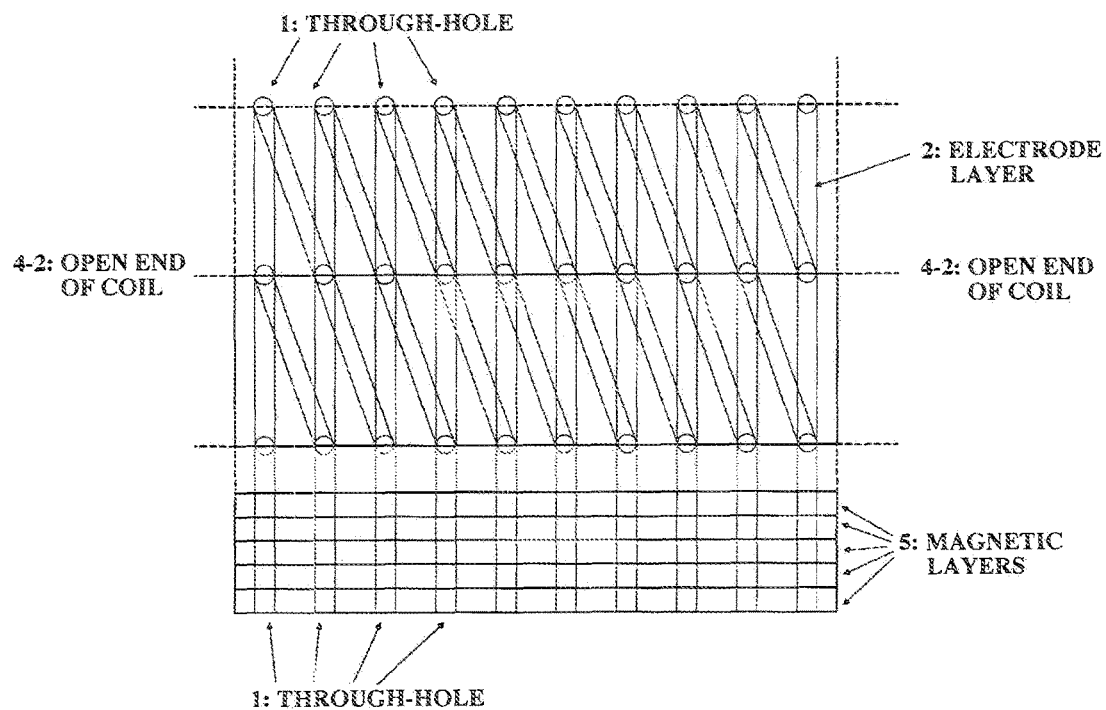
FIG. 9 is a view showing a laminated structure of a coil portion of a magnetic antenna according to the present invention.

Then, as shown in FIG. 9, a desired number of through-holes (1) are formed through the thus obtained laminate comprising the magnetic layers. The electrode material is poured into the respective through-holes (1). Also, the electrode material is applied on both surfaces of the laminate which are perpendicular to the through-holes, to form an electrode layer (2) in the form of a coil (wire winding) which is connected with the electrode material poured into the through-holes. The electrode material poured into the through-holes and the electrode layer cooperate so as to form a plurality of coils (4-1) around a rectangular core constituted from the magnetic layers. The plurality of the coils (4-1) are connected in parallel to each other in an electric circuit. In this case, there is obtained such a construction in which both ends of the magnetic layers on which opposite end coils among the plurality of the coils disposed in series are provided, are open ends (4-2) of a magnetic circuit.

Next, as shown in FIG. 2, insulating layers (6) are respectively formed on upper and lower surfaces of the coil on which the electrode layer (2) is provided.

The thus obtained sheet is cut into a desired shape along the through-holes (1) and the open ends (4-2) of the coils and then integrally calcined, or is integrally calcined and then cut into a desired shape along the through-holes and the open ends of the coils, thereby producing the magnetic antenna (LTCC technology).

The magnetic antenna having such a core as shown in FIG. 3 according to the present invention may be produced, for example, by the following method.

First, a mixture prepared by mixing magnetic particles and a binder is formed into a sheet shape to form a single magnetic layer or a plurality of magnetic layers which are laminated together.

Separately, a mixture prepared by mixing non-magnetic particles and a binder is formed into a sheet shape to form a single non-magnetic layer or a plurality of non-magnetic layers which are laminated together.

Next, as shown in FIG. 3(a), the magnetic layers (5) and the non-magnetic layers (8) are alternately laminated to obtain a laminate having a desired total thickness.

Then, a desired number of through-holes (1) are formed through the thus obtained laminate comprising the magnetic layers and the non-magnetic layers. The electrode material is poured into the respective through-holes. Also, the electrode material is applied on both surfaces of the laminate which are perpendicular to the through-holes, to form an electrode layer (2) in the form of a coil (wire winding) which is connected with the electrode material poured into the through-holes. The electrode material poured into the through-holes and the electrode layer cooperate so as to form coils around a rectangular core constituted from the magnetic layers. In this case, there is obtained such a construction in which both terminal ends of the magnetic layers on which the coils are formed are open ends of a magnetic circuit (FIG. 9).

Next, as shown in FIG. 2, insulating layers (6) are respectively formed on upper and lower surfaces of the coils on which the electrode layer is provided.

The thus obtained sheet is cut into a desired shape along the through-holes and the open ends of the coils and then integrally calcined, or is integrally calcined and then cut into a desired shape along the through-holes and the open ends of the coils, thereby producing the magnetic antenna (LTCC technology).

The conductive layer (7) may be formed by any suitable method, for example, by an ordinary method such as printing and brush coating. Alternatively, a metal plate may be attached to an outside of the insulating layer to thereby attain the same effect as the conductive layer.

As a material for forming the conductive layer or the electrode material to be poured into the through-holes, there may be suitably used an Ag paste as well as Ag-based alloy pastes and metal-based conductive pastes.

The thickness of the conductive layer (7) to be formed on an outside of the insulating layer is preferably 0.001 to 0.1 mm.

Figure 8:
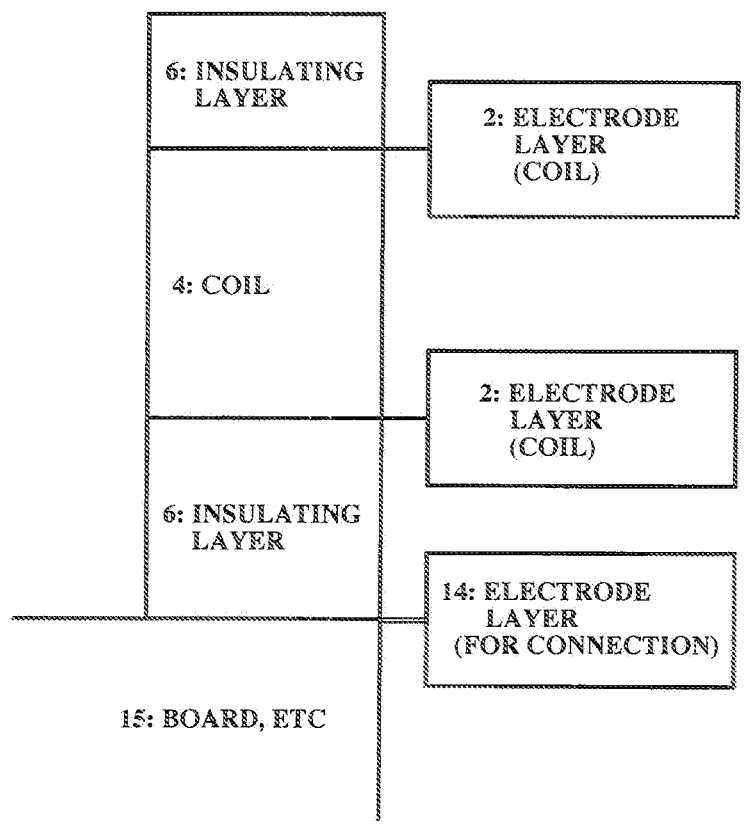
FIG. 8 is a conceptual view showing a board on which a magnetic antenna according to the present invention is mounted.

As schematically shown in FIG. 8, in the magnetic antenna of the present invention, the insulating layer (6) formed on a lower surface of the coils (4) may be provided therethrough with through-holes into which the electrode material is poured to connect with both the ends of the coils, and further a board connecting terminal (14) formed of the electrode material may be disposed on the lower surface of the insulating layer, followed by integrally calcining the thus obtained structure. In this case, the resulting magnetic antenna may be readily bonded to a board formed of ceramic materials, resins, etc. Meanwhile, as the board, there may be used those boards formed of a composite material of the above various materials, a metal-containing material, etc.

In addition, the board on which the magnetic antenna of the present invention is mounted is characterized in that the magnetic antenna is fixed on a surface of the board (15) by means of a bonding agent, an adhesive or soldering. In the present invention, the magnetic antenna is mounted together with the other parts at the same time by the methods generally used for mounting various parts onto a multi-layer wiring board. Therefore, the board on which the magnetic antenna according to the present invention is mounted can be mass-produced with a high productivity.

In the multi-layer wiring board, wirings formed of a conductive material are disposed in a built-in state, and have the same adverse influence on the magnetic antenna as that exerted by metals. However, the board on which the magnetic antenna according to the present invention is mounted has the above-mentioned structure, and is therefore free from adverse influence by metals. Even when any wirings formed of a conductive material are provided inside or on a surface of the multi-layer wiring board, etc., the magnetic antenna can be prevented from suffering from any adverse influence by the wirings.

The IC may be connected with an IC chip connecting terminal formed on the insulating layer provided on an upper surface of the magnetic antenna as shown in FIG. 2. Alternatively, as also shown in FIG. 8, the IC may be connected with the board connecting terminal (14) through wirings provided inside of the board. Further, the magnetic antenna may be connected with a reader/writer through the inside board wirings connected to the board connecting terminal (14) formed on the lower surface thereof to use the magnetic antenna for the reader/writer.

In addition, the magnetic antenna of the present invention may be installed in a communication device.

Further, the magnetic antenna of the present invention may be installed in a packaging container.

Furthermore, the magnetic antenna of the present invention may be fitted to metal parts such as tools and bolts.

<Function>

In the magnetic antenna of the present invention, a plurality of coils which are formed of a coil-shaped electrode material around a central magnetic core are connected in parallel to each other in an electric circuit and disposed in series on the common magnetic core, so that each coil can be designed such that an inductance $L_1$ thereof which is limited by a resonance frequency used therefor is increased up to as large a level as possible. In addition, since a combined inductance $L_0$ of the magnetic antenna is controlled to adapt to the resonance frequency, the deterioration in communication sensitivity thereof can be minimized.

The electromotive force (e) induced in the coils is represented by the following formula (3) using an amount of change in electric current per unit time (dI/dt).

$$e=-L(dI/dt) \qquad \text{<Formula (3)>}$$

Therefore, as the inductance L of the coils increases, the electromotive force induced therein becomes larger.

In general, in the magnetic antenna used in the applications such as 13.56 MHz RFID, a resonance frequency $f_0$ is determined according to the following formula (4).

$$f_0=1/(2\pi\times(L\times C)^{(1/2)}) \qquad \text{<Formula (4)>}$$

For this reason, owing to a capacitance of the IC mounted to the magnetic antenna and a parasitic capacitance of the magnetic antenna itself, there is present such a limitation that the inductance $L_0$ of the coils must be controlled to the value not more than a certain limited value.

On the other hand, an inductive voltage of a tag constituted from combination of the RF tag and a reader/writer is represented by the following formula (5) using a mutual inductance M.

$$e=-M(dI/dt)=k((L_1L_2)^{(1/2)})\times(dI/dt) \qquad \text{<Formula (5)>}$$

wherein $L_1$ is an inductance of and antenna of the reader/writer; and $L_2$ is an inductance of the antenna of the tag.

In consequence, as the inductance of the antenna of the tag increases, the voltage induced in the tag can be increased and the degree of coupling thereof can be enhanced.

In the present invention, a plurality of the coils are connected in parallel to each other. Therefore, assuming that the inductances $L_1$ of the respective coils are identical to each other, the combined inductance $L_0$ of the magnetic antenna is represented by the following formula (6).

$$L_0=L_1\text{(per one coil)/number of coils} \qquad \text{<Formula (6)>}$$

Accordingly, as the number of the coils increases, the inductance $L_1$ of each of the coils connected in parallel to each other can be designed to become larger.

In the present invention, the inductance $L_1$ of each coil increases, whereas the respective coils are connected such that the combined inductance $L_0$ of the magnetic antenna itself is adapted to the resonance frequency. As a result, it is possible to enhance a communication sensitivity of the magnetic antenna.

As described in Patent Document 2, when the adjacent ones of the coils connected in parallel to each other are coupled with each other, the combined inductance of the magnetic antenna becomes larger than the value calculated from the formula (4), and the value Q of the electric circuit also becomes larger.

It is desirable to design the electric circuit so as to have a large value Q because an electric power in the resonance circuit becomes Q times that received in the coils. However, when the value Q is designed to become excessively large, the communication sensitivity is fluctuated to a large extent owing to deviation of the frequency caused by variation of external environmental conditions or IC, etc. Therefore, the value Q is preferably designed to lie with the range represented by the following formula (7).

$$Q=13.56 \text{ MHz/frequency band used} \qquad \text{<Formula (7)>}$$

Examples

In the followings, the present invention is described in more detail on the basis of preferred embodiments thereof by referring to the accompanying drawings.

[Magnetic Antenna 1]

In order to form a magnetic layer (5), 100 parts by weight of precalcined Ni—Zn—Cu ferrite particles which had been found to have a magnetic permeability of 100 as a magnetic material at 13.56 MHz upon sintering at 900° C. ($Fe_2O_3$: 48.5 mol %; NiO: 25 mol %; ZnO: 16 mol %; CuO: 10.5 mol %), 8 parts by weight of a butyral resin, 5 parts by weight of a plasticizer, and 80 parts by weight of a solvent were mixed in a ball mill to prepare a slurry. The resulting slurry was applied on a PET film by a doctor blade to form a coating layer with a size of 150 mm×150 mm such that the thickness of the coating layer obtained after sintering was 0.1 mm, thereby obtaining a sheet.

In order to form an insulating layer (6), 100 parts by weight of precalcined Zn—Cu ferrite particles ($Fe_2O_3$: 48.5 mol %; ZnO: 41 mol %; CuO: 10.5 mol %), 8 parts by weight of a butyral resin, 5 parts by weight of a plasticizer, and 80 parts by weight of a solvent were mixed in a ball mill to prepare a slurry. The resulting slurry was applied on a PET film by a doctor blade to form a coating layer with the same size and thickness as those of the sheet for the magnetic layer, thereby obtaining a sheet.

Next, as shown in FIG. 9, through-holes (1) were formed through green sheets for the magnetic layer (5) and filled with an Ag paste. In addition, an Ag paste was printed on both surfaces of a laminated sheet of the green sheets which are perpendicular to the through-holes (1). The ten laminated sheets prepared above were laminated on one another such that five coils (4-1) were electrically connected in parallel to each other.

Next, as shown in FIG. 4, green sheets for the insulating layer (6) were respectively laminated on upper and lower surfaces of the coil (4-1). In this case, on one of the upper and lower surfaces of the coil, the green sheet for an insulating layer (6) on which a conductive layer (7) was formed by printing an Ag paste thereon was laminated.

The thus laminated green sheets were bonded together by applying a pressure thereto. The resulting laminate was cut along the lines passing through the through-holes and the coil open ends (4-2), and integrally calcined at 900° C. for 2 hr, thereby obtaining a magnetic antenna 1 (with a size of 30 mm in width×4 mm in length) on which five coils each having a coil winding number of 23 turns were electrically connected in parallel to each other (in these figures, the coil winding number is shown in a simplified manner, and the number of the magnetic layers laminated is also shown in a simplified manner. The other drawings are also shown in the same way).

Further, an IC for an RF tag (capacitance of IC: 23.5 pF) was connected to both ends of the coil of the magnetic antenna 1, and a capacitor was connected in parallel to the IC. Then, the resonance frequency was adjusted to 13.56 MHz, thereby obtaining an RF tag. The communication distance of the thus obtained RF tag, i.e., the distance over which it was able to communicate with a reader/writer having an output of 100 mW, was measured.

The respective measuring methods are described below.

[Methods for Measuring and Adjusting Resonance Frequency]

The resonance frequency was measured by the following method. That is, a one-turn coil was connected to an impedance analyzer "4291A" manufactured by Agilent Technology Co., Ltd., and was in turn coupled with the RF tag. The peak frequency of the measured impedance was determined as the resonance frequency.

The combined inductance of the magnetic antenna and the capacitance of the capacitor component were measured using an impedance analyzer "4291A" manufactured by Agilent Technology Co., Ltd. In addition, upon measurement of the inductance and parasitic capacitance of the respective coils, the wiring connected between a plurality of the coils thus prepared was cut to measure the inductance and parasitic capacitance of only one coil.

[Method for Measuring Communication Distance]

The communication distance was measured by the following method. That is, an antenna of a reader/writer having an output of 100 mW (product name "TR3-A201/TR3-C201" manufactured by Takaya Co., Ltd.) was fixed horizontally, and the RF tag was placed above the antenna such that the length direction of the RF tag was perpendicular to the antenna. Then, the RF tag was moved within the range in which it was able to communicate with the reader/writer at 13.56 MHz, and the maximum distance in the vertical direction between the antenna and the RF tag was determined as the communication distance.

[Magnetic Antenna 2]

In order to form a magnetic layer (5), 100 parts by weight of pre-calcined Ni—Zn—Cu ferrite particles which had been found to have a magnetic permeability of 100 as a magnetic material at 13.56 MHz upon sintering at 900° C. ($Fe_2O_3$: 48.5 mol %; NiO: 25 mol %; ZnO: 16 mol %; CuO: 10.5 mol %), 8 parts by weight of a butyral resin, 5 parts by weight of a plasticizer, and 80 parts by weight of a solvent were mixed in a ball mill to prepare a slurry. The resulting slurry was applied on a PET film by a doctor blade to form a coating layer with a size of 150 mm×150 mm such that the thickness of the coating layer obtained after sintering was 0.1 mm, thereby obtaining a sheet.

In order to form a non-magnetic layer (8), 100 parts by weight of a borosilicate glass ($SiO_2$: 86 to 89% by weight; $B_2O_3$: 7 to 10% by weight; $K_2O$: 0.5 to 7% by weight), 8 parts by weight of a butyral resin, 5 parts by weight of a plasticizer, and 80 parts by weight of a solvent were mixed in a ball mill to prepare a slurry. The resulting slurry was applied on a PET film by a doctor blade to form a coating layer with a size of 150 mm×150 mm such that the thickness of the coating layer obtained after sintering was 0.05 mm, thereby obtaining a sheet.

In order to form an insulating layer (6), 100 parts by weight of pre-calcined Zn—Cu ferrite particles ($Fe_2O_3$: 48.5 mol %; ZnO: 41 mol %; CuO: 10.5 mol %), 8 parts by weight of a butyral resin, 5 parts by weight of a plasticizer, and 80 parts by weight of a solvent were mixed in a ball mill to prepare a slurry. The resulting slurry was applied on a PET film by a doctor blade to form a coating layer with the same size and thickness as those of the sheet for the magnetic layer, thereby obtaining a sheet.

Next, as shown in FIG. 3(*a*), sheets each prepared by laminating one green sheet for the magnetic layer (5) and one green sheet for the non-magnetic layer (8) were pressed and bonded together to form one laminated sheet, and through-holes (1) were formed therethrough and filled with an Ag paste. Then, an Ag paste was printed on both surfaces of the laminated sheet which are perpendicular to the through-holes (1). The ten laminated sheets prepared above were laminated on one another to form the coil (4).

Next, as shown in FIG. 4, green sheets for the insulating layer (6) were laminated on upper and lower surfaces of the coil (4). In this case, on one of the upper and lower surfaces of the coil, the green sheet for the insulating layer (6) on which a conductive layer (7) was formed by printing an Ag paste thereon was laminated.

The thus laminated green sheets were bonded together by applying a pressure thereto. The resulting laminate was cut along the lines passing through the through-holes and the coil open ends (4-2), and integrally calcined at 900° C. for 2 hr, thereby obtaining a magnetic antenna 2 (with a size of 30 mm in width×4 mm in length) on which five coils each having a coil winding number of 23 turns were electrically connected in parallel to each other.

Similarly to the magnetic antenna 1, an IC for an RF tag was connected to the magnetic antenna 2, and a capacitor was connected in parallel to the IC. Then, the resonance frequency was adjusted to 13.56 MHz, thereby obtaining an RF tag. The communication distance of the thus obtained RF tag, i.e., the distance over which it was able to communicate with a reader/writer having an output of 100 mW, was measured.

[Magnetic Antenna 3]

A glass ceramic paste was printed on the green sheet for the magnetic layer (5) produced in the same manner as defined in Magnetic Antenna 1 such that the thickness of the resulting coating layer was 0.02 mm. The thus obtained sheets were laminated on one another to obtain a laminated sheet having 10 magnetic layers.

Then, through-holes (1) were formed through the laminated sheet comprising the green sheets for the magnetic layers (5) and filled with an Ag paste. Then, an Ag paste was printed and laminated on both surfaces of the laminated sheet which are perpendicular to the through-holes (1) to form the coil (4).

Next, the green sheet for the insulating layer (6) on which the conductive layer (7) was formed by printing an Ag paste thereon was laminated on one surface of the coil (4). The other surface of the coil was laminated with the green sheet for the insulating layer (6) through which through-holes were formed to connect with both ends of the coil and filled with an Ag paste and which was formed on its surface layer perpendicular to the through-holes (1) with a coil lead terminal and an IC chip connecting terminal (9) by printing an Ag paste into shapes of these terminals thereon.

The thus laminated green sheets were bonded together by applying a pressure thereto. The resulting laminate was cut along the lines passing through the through-holes (1) and the coil open ends (4-2), and integrally calcined at 900° C. for 2 hr, thereby obtaining a magnetic antenna 3 (with a size of 10 mm in width×3 mm in length) on which five coils each having a coil winding number of 23 turns were electrically connected in parallel to each other.

Then, an IC for an RFID tag was connected to both ends of the coil of the magnetic antenna, and a capacitor was connected in parallel to the IC. Then, the resonance frequency was adjusted to 13.56 MHz, thereby obtaining an RF tag. The communication distance of the thus obtained RF tag, i.e., the distance over which it was able to communicate with a reader/writer having an output of 100 mW was measured.

As a result, it was confirmed that the communication distance of the magnetic antenna 3 was 12.0 cm, whereas the communication distance of the magnetic antenna 3 to which a metal plate was attached was 10.5 cm.

[Magnetic antenna 4]

The green sheet for the magnetic layer (5) and the glass ceramic green sheet for the non-magnetic layer (8) were respectively produced in the same manner as defined in Magnetic Antenna 1, such that the thicknesses of the green sheet for the magnetic layer (5) and the glass ceramic green sheet for the non-magnetic layer (8) both were 0.1 mm. The thus obtained green sheets were respectively cut into a width of 0.1 mm using a cutting machine for ceramic green sheet laminates ("G-CUT" manufactured by UHT Co., Ltd.). Then, as shown in FIG. 3(b), the cut green sheets were alternately placed side by side in the order of the magnetic layer and the non-magnetic layer in the form of one sheet, and then pressed and bonded together. The ten thus obtained sheets were alternately staked on one another such that the magnetic layer and the non-magnetic layer were also placed side by side in the vertical direction, thereby preparing a laminated sheet to be ready for pressing and bonding. Then, through-holes (1) were formed through each green sheet and filled with an Ag paste, and further an Ag paste was printed on both surfaces of the laminated sheet which were perpendicular to the through-holes (1). The ten green sheets were laminated on one another, thereby obtaining the coil (4).

The thus obtained coil was provided thereon with the insulating layer in the same manner as defined in production of the above magnetic antenna 1, thereby obtaining a magnetic antenna 4 on which five coils were electrically connected in parallel to each other.

[Magnetic antenna 5]

The green sheet for the magnetic layer (5) and the glass ceramic green sheet for the non-magnetic layer (8) were respectively produced in the same manner as defined in Magnetic Antenna 1, such that the thicknesses of the green sheet for the magnetic layer (5) and the glass ceramic green sheet for the non-magnetic layer (8) both were 0.1 mm. The thus obtained green sheets were respectively cut into a width of 0.1 mm using a cutting machine for ceramic green sheet laminates ("G-CUT" manufactured by UHT Co., Ltd.). Then, as shown in FIG. 3(c), the cut green sheets were alternately placed side by side in the order of the magnetic layer and the non-magnetic layer in the form of one sheet, and then pressed and bonded together. The ten thus obtained sheets and the ten glass ceramic green sheets were alternately staked on one another, thereby preparing a laminated sheet to be ready for pressing and bonding. Then, through-holes (1) were formed through each green sheet and filled with an Ag paste, and further an Ag paste was printed on both surfaces of the laminated sheet which were perpendicular to the through-holes (1). The ten green sheets were laminated on one another, thereby obtaining the coil (4).

The thus obtained coil was provided thereon with the insulating layer in the same manner as defined in production of the above magnetic antenna 1, thereby obtaining a magnetic antenna 5 on which five coils were electrically connected in parallel to each other.

[Magnetic antenna 6]

The slurry produced in the same manner as defined in Magnetic Antenna 1, was used for producing a magnetic bar for the magnetic layer (5). As shown in FIG. 3(d), the thus produced magnetic bars were arranged in a container, and then a slurry of a non-magnetic glass ceramic material was poured into the container to thereby obtain a sheet having a thickness of 1 mm. The thus obtained sheets and the glass ceramic green sheets were alternately staked on one another in total 10 sheets, thereby preparing a laminated sheet to be ready for pressing and bonding. Then, as shown in FIG. 4, through-holes (1) were formed through each green sheet and filled with an Ag paste, and further an Ag paste was printed on both surfaces of the laminated sheet which were perpendicular to the through-holes (1). The ten green sheets thus stacked were laminated on one another, thereby obtaining the coil (4).

The thus obtained coil was provided thereon with the insulating layer in the same manner as defined in production of the magnetic antenna 1, thereby obtaining a magnetic antenna 6 on which five coils were electrically connected in parallel to each other.

[Magnetic Antenna 7: Comparative Example]

The magnetic antenna 7 was produced in the same manner as defined in production of the magnetic antenna 1 except that only one coil having a winding number of 23 turns was formed. As a result, it was confirmed that the communication distance between the magnetic antenna 7 and the reader/writer having an output of 100 mW was 6.0 cm.

Various properties of the thus obtained magnetic antennas are shown in Table 1 below.

TABLE 1

| Examples and Comp. Example | Combined inductance $L_0$ [μH] | Inductance per one coil $L_1$ [μH] | Upper limit of combined inductance calculated from relational formula (1)* [μH] | Communication distance [cm] |
|---|---|---|---|---|
| Magnetic antenna 1 | 2.90 | 14.5 | 3.17 | 12.0 |
| Magnetic antenna 2 | 2.94 | 14.7 | 3.17 | 12.5 |
| Magnetic antenna 3 | 2.96 | 14.8 | 3.17 | 12.7 |
| Magnetic antenna 4 | 3.00 | 15.0 | 3.17 | 12.3 |
| Magnetic antenna 5 | 3.04 | 15.2 | 3.17 | 13.5 |
| Magnetic antenna 6 | 3.10 | 15.5 | 3.17 | 14.0 |
| Magnetic antenna 7 (Comp. Example) | 3.50 | 3.5 | 4.67 | 6.0 |

Note
*$1/(4\pi^2 \times 13.56^2 \times \text{(capacitance of IC + parasitic capacitance)})$ As shown in Table 1, it was recognized that the inductance $L_1$ per a coil of the respective RF tags according to the present invention (magnetic antennas 1 to 6) was larger than the value calculated from the formula: $1/(4\pi^2 \times \text{(operating frequency)}^2 \times \text{(capacitance of IC+parasitic capacitance of antenna)})$, whereas the combined inductance $L_0$ of the respective magnetic antennas was smaller than the value calculated from the formula: $1/(4\pi^2 \times \text{(operating frequency)}^2 \times \text{(capacitance of IC+parasitic capacitance)})$. In addition, it was confirmed that the respective RF tags according to the present invention (magnetic antennas 1 to 6) all had a long communication distance.

The magnetic antennas according to the present invention all were capable of suitably controlling a resonance frequency thereof even when the coils were designed to have a large inductance. Further, it was confirmed that when dividing the magnetic core into plural parts by the non-magnetic materials, the magnetic antennas exhibited a high effective magnetic permeability and were improved in both reduction in size and communication sensitivity.

INDUSTRIAL APPLICABILITY

The RF tag of the present invention has a further enhanced sensitivity, can be used for a longer distance communication. Therefore, the RF tag can be suitably used in the applications such as 13.56 MHz RFID. In addition, the magnetic antenna and the RF tag according to the present invention have a high communication sensitivity and, therefore, can be suitably used in various applications such as various portable equipments, containers, metal parts, boards, metal tools and metal molds.

The invention claimed is:

1. An RF tag comprising a magnetic antenna for transmitting and receiving information using an electromagnetic induction method, and an IC mounted to the magnetic antenna, which magnetic antenna comprises a magnetic core and a plurality of coils formed on the magnetic core, which coils each have an inductance $L_1$ satisfying the following relational formula (1) such that the inductances $L_1$ of the coils are identical to each other, and are connected in parallel to each other in an electric circuit and disposed in series on the same, common magnetic core, a combined inductance $L_0$ of the magnetic antenna satisfying the following relational formula (2):

$$L_1 \geq 1/(4\pi^2 \times (\text{operating frequency})^2 \times (\text{capacitance of } IC + \text{parasitic capacitance of antenna})) \quad \text{<Relational formula (1)>}$$

wherein $L_1$ is an inductance per one coil;

$$L_0 \leq 1/(4\pi^2 \times (\text{operating frequency})^2 \times (\text{capacitance of } IC + \text{parasitic capacitance of antenna})) \quad \text{<Relational formula (2)>}$$

wherein $L_0$ is a combined inductance of the magnetic antenna.

2. An RF tag according to claim 1, wherein the RF tag is coated with a resin.

3. An RF tag according to claim 1, wherein $L_1$ is not less than 3 times $L_0$.

* * * * *